(12) United States Patent
McNamara et al.

(10) Patent No.: US 6,687,662 B1
(45) Date of Patent: *Feb. 3, 2004

(54) SYSTEM AND METHOD FOR AUTOMATED DESIGN VERIFICATION

(75) Inventors: Michael Thomas York McNamara, Santa Clara, CA (US); Chong Guan Tan, Saratoga, CA (US); David Todd Massey, Boulder Creek, CA (US)

(73) Assignee: Verisity Design, Inc., Mountain View, CA (US)

( * ) Notice: Subject to any disclaimer, the term of this patent is extended or adjusted under 35 U.S.C. 154(b) by 425 days.

This patent is subject to a terminal disclaimer.

(21) Appl. No.: 09/668,017

(22) Filed: Sep. 21, 2000

Related U.S. Application Data

(63) Continuation of application No. 08/908,248, filed on Aug. 7, 1997, now Pat. No. 6,141,630.

(51) Int. Cl.$^7$ ............................................... G06F 17/50
(52) U.S. Cl. ................... 703/14; 716/4; 716/5; 716/25; 714/738
(58) Field of Search ..................... 714/741, 25, 28, 714/30, 32, 724, 735, 738, 739, 33, 726; 703/14, 2, 15; 716/4, 5, 25; 702/120; 371/22.1, 23

(56) References Cited

U.S. PATENT DOCUMENTS

| | | |
|---|---|---|
| 5,228,040 A | 7/1993 | Agrawal et al. ............. 714/724 |
| 5,243,538 A | 9/1993 | Okuzawa et al. ....... 395/500.06 |
| 5,257,268 A | 10/1993 | Agrawal et al. ........ 395/500.05 |
| 5,430,736 A | 7/1995 | Takeoka et al. ........ 395/500.05 |
| 5,475,624 A | 12/1995 | West ...................... 395/500.36 |
| 5,542,043 A | 7/1996 | Cohen et al. .................. 714/32 |
| 5,724,504 A | 3/1998 | Aharon et al. .......... 395/500.05 |
| 5,740,086 A | 4/1998 | Komoto ...................... 364/580 |
| 5,831,998 A | 11/1998 | Ozmizrak .................... 714/741 |
| 6,141,630 A | * 10/2000 | McNamara et al. ........... 703/14 |
| 6,487,704 B1 | * 11/2002 | McNamara et al. ............ 716/5 |

OTHER PUBLICATIONS

Touba et al., N. Automated Logic Synthesis of Random Pattern Testable Circuits, Test Conference, International, Oct. 1994, pp. 174–183.*

Cherukuri et al., N. An Automated Network Generator for Design Verification of Electronic Packages, Multi–Chip Module Conference, IEEE, Feb. 1995, pp. 99–104.*

Abhijit Ghosh, Sequential Test Generation and Synthesis for Testability at the Register–Transfer and Logic Levels. IEEE Transactions on Computer–Aided Design of Integrated Circuits and Systems, May 1993, vol. 12, No. 5, pp. 579–598, whole document.

(List continued on next page.)

Primary Examiner—Russell Frejd
(74) Attorney, Agent, or Firm—Glenn Patent Group; Michael A. Glenn; Christopher Peil

(57) ABSTRACT

A system and method for automated design verification. A test bench stimulates a simulated design with test vectors. A coverage analysis tool monitors output data from the simulated design and identifies portions of the simulated design that remain to be tested. A test generator produces and sends test vectors to the test bench which exercise (i.e., test) the portions of the simulated design that the coverage analysis tool has indicated still remain untested. In the method, a first step executes a simulated design on a test bench. A second step interprets the simulated design as if this design were a state diagram composed of a set of basic blocks interconnected by transition arcs. A third step generates test vectors to exercise some of the basic blocks and transition arcs. A fourth step reports the basic blocks and transition arcs which have not been tested. A fifth step generates a new set of test vectors to exercise the as yet untested basic blocks and transition arcs.

16 Claims, 7 Drawing Sheets

OTHER PUBLICATIONS

Steve Carlson et al., HDL Automation Targets Network Designs. Engineering Times, Nov. 11, 1996, No. 927, pp. (4), whole documents.

Ho et al., "Architecture Validation for Processors", Proceedings of the 22nd Annual International Symposium on Computer Architectures, pp. 404–413, Jun. 1995.

Ho et al.; "Validation Coverage Analysis for Complex Digital Designs", Digest of Technical Papers of the IEEE/ACM International Conference on Computer–Aided Design, pp. 146–151, Nov. 1996.

Armstrong, J. R.; "Efficient Approaches to Testing VHDL DSP Models", 1995 International Conference on Acoustics, Speech and Signal Processing, vol. 5, pp. 2865–2867, May 1995.

Kapoor et al.; "An Automatic Test Bench Generation System", Proceedings of the VHDL International Users Forum, pp. 8–17, May 1994.

McCabe, P. A.; "VHDL–based System Simulation and Performance Measurement", Proceedings of the VHDL International Users Forum, pp. 48–57, May 1994.

Hoskote et al.; "Automatic extraction of the Control Flow Machine and Application to Evaluating Coverage of Verification Vectors", Proceedings of the IEEE International Conference on Computer Design: VLSI in Computers and Processors, pp. 532–537, Oct. 1995.

Mingyu et al., "Fault Coverage Analysis in Respect to an FSM Specification", Preceedings of the IEEE INFOCOM '94—Networking for Global Communications, vol. 2, pp. 768–775, Jun. 1994.

* cited by examiner

SYSTEM AND METHOD FOR AUTOMATED DESIGN VERIFICATION

CROSS REFERENCE TO RELATED APPLICATIONS

This application is a continuation of U.S. patent application Ser. No. 08/908,248, filed Aug. 7, 1997, now U.S. Pat. No. 6,141,630.

BACKGROUND OF THE INVENTION

1. Field of the Invention

The present invention relates generally to systems and methods for testing circuit design descriptions, and more particularly to systems and methods for automated design description verification within an electronic design automation (EDA) environment.

2. Discussion of Background Art

Electronic Design Automation (EDA) is a process for using computer programs to design, simulate, and test electronic circuits before they are fabricated. By simulating designs with simulation software, on emulation systems, and/or by using simulation acceleration systems, design flaws are detected and corrected before fabrication of the silicon device. A testing before fabrication process saves manufacturers millions of dollars in non-recoverable engineering (NRE) costs. However, as designs increase in complexity, so too does the difficulty of testing. In fact, the difficulty of testing with traditional EDA verification tools increases geometrically with the number of gates. System designers are also asked to design and test these increasingly complex circuits within ever smaller time frames. As a result, manufacturers must choose between either taking more time to test the design, and thereby delaying product shipment, or only testing portions of the circuit, and thereby risking that many undiscovered bugs get passed on to the users.

One approach to this problem is to speed up the design simulation programs. Native Code Simulators, Simulation Acceleration, and Chip Emulation System all decrease the time it takes to simulate a design, and may sometimes decrease the time it takes to identify the next bug in a design. However, during early stages of the design process, design bugs are prevalent, and speeding up the simulation does little to help identify these bugs.

Another approach is to test the circuit design randomly. Random testing involves generating a plurality of unique test vectors that are randomly related to each other and then testing (or "exercising") the design with these vectors. In this approach, as time allotted for random testing increases, more of the circuit design is tested. Random testing is a time consuming and risky proposition, since discovering bugs then becomes a hit or miss proposition, and there is rarely sufficient time to test the circuit design fully. Moreover, it is quite possible, even likely that running a random simulation for ten or one hundred times longer will not significantly increase the verification density.

Other types of EDA testing tools, such as an Automatic Test Pattern Generation (ATPG) tools, produce tests which only identify manufacturing defects in an already fabricated circuit. Testing is performed by successively applying known input values to the pins of the circuit, and then comparing actual output values with a set of expected output values. However, ATPG tools assume that the circuit already has a fundamentally correct design and that any anomalies that are discovered are only due to physical defects introduced in the manufacturing process, such as broken wires.

EDA testing tools, such as Verilint, developed by Inter-HDL of Los Altos, Calif.; Vericov, developed by Simulation Technology of Saint Paul, Minn.; Vera, developed by System Science of Palo Alto, Calif.; and Specman, developed by Verisity of Yehud, Israel; also exist but they are difficult to use, sell, and integrate into a test bench for verifying the correctness of circuit designs.

What is needed is an apparatus and method for design verification that overcomes the problems of the prior art.

SUMMARY OF THE INVENTION

The present invention is a system and a method for automated design verification. Within the system of the present invention, a test bench is created to stimulate a simulated design with test vectors. A coverage analysis tool monitors output data from the simulated design and identifies which portions of the design remain to be tested. A test generator produces test vectors and sends them to the test bench which exercises the portions of the simulated design which the coverage analysis tool has indicated remain to be tested. With the method of the present invention, a design description is interpreted by a test generator as a state diagram composed of a set of basic blocks interconnected by transition arcs. The test generator produces a plurality of test vectors for exercising the basic blocks and transition arcs. A computer program processes the design description and creates a simulated design. Basic blocks and transition arcs within the simulated design are exercised by the plurality of test vectors. Those basic blocks and transition arcs which have (and have not) been exercised are identified by a coverage analysis program which monitors the simulated design's internal operation. The test generator receives these reports and in response produces a new set of test vectors to exercise the basic blocks and transition arcs which were not yet tested. A first set of output data from the simulated design may then be compared against a second set of output data received from a reference. The first set of output data may also be compared with a set of optional constraints. These comparisons result in an anomaly report if the first set of output data is not equivalent to either the second set of output data or the set of optional constraints. The test generator then correlates the basic blocks and transition arcs exercised by the test vectors with the results from the reporting step to localize and identify any of the basic blocks and transition arcs within the simulated design which were operating incorrectly or indeterminately.

The apparatus and method of the present invention are particularly advantageous over the prior art because a critical part of design verification—previously performed, manually and on a sporadic basis due to engineering resource requirements and time-to-market considerations—is now automated. The present invention permits testing of basic blocks, transition arcs, and paths of interest within the simulated design using a quick, easy, comprehensive, and integrated process. As a result, designers can proceed toward fabrication with confidence that the simulated design has been verified. A time savings of months is achieved, since any design flaws are discovered before the simulated design is fabricated.

These and other aspects of the invention will be recognized by those skilled in the art upon review of the detailed description, drawings, and claims set forth below.

DETAILED DESCRIPTION OF THE PREFERRED EMBODIMENT

Figure 1:
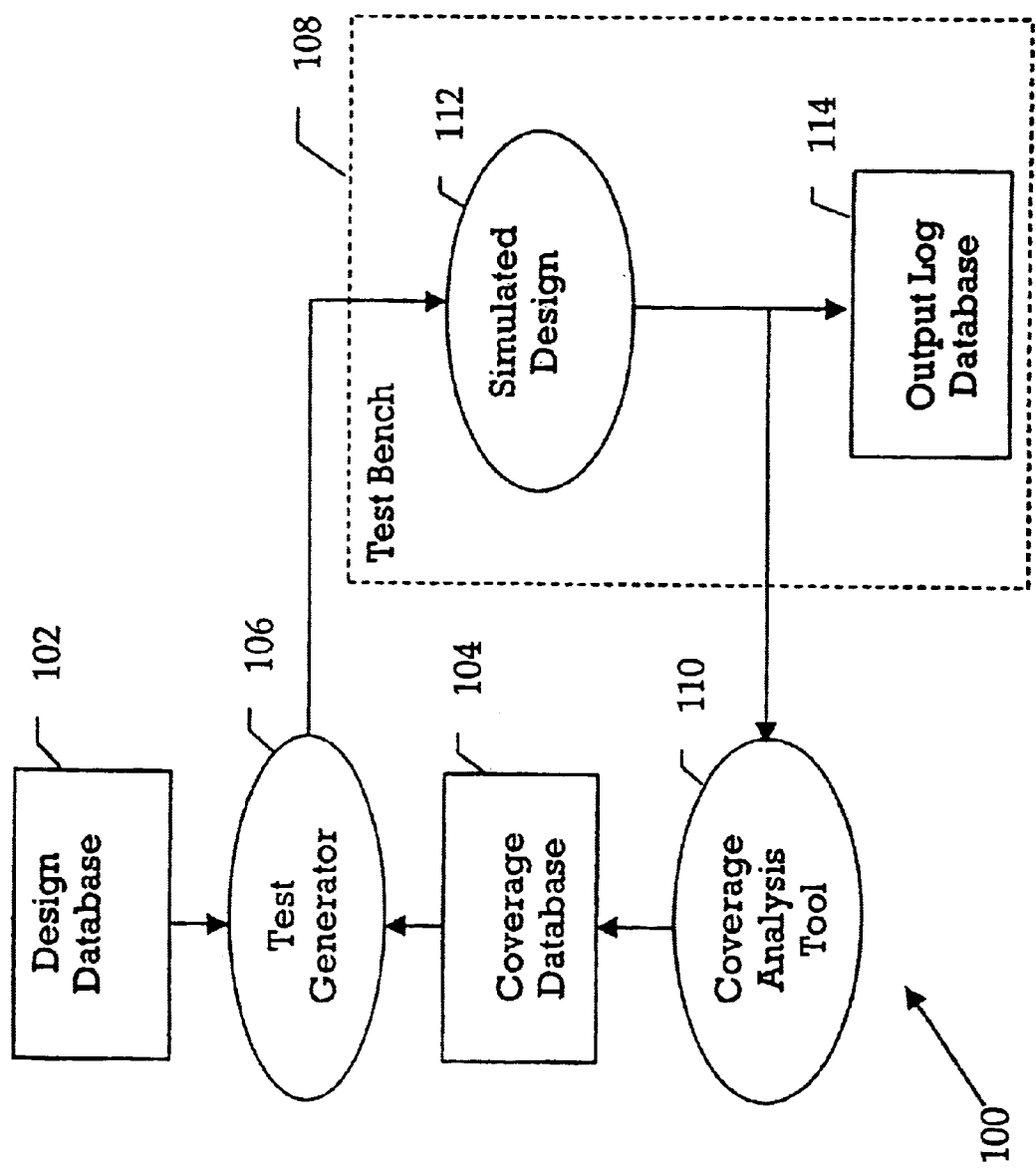
FIG. 1 is a data-flow diagram of a first exemplary system for automated design verification according to the present invention.

FIG. 1 is a data-flow diagram of a first exemplary system 100 for automated design verification according to the present invention. The system 100 includes a design database 102, a coverage database 104, a test generator 106, a test bench 108, and a coverage analysis tool 110. The test bench 108 includes a simulated design 112 and an output log database 114.

The design database 102 contains one or more circuit designs. These circuit designs are typically coded in a known design language, such as Verilog, VHDL, or C++. These coding languages are also used with other Electronic Design Automation (EDA) tools to simulate, test and fabricate the design of the circuit. The coverage database 104 contains a map of each state and transition arc within a circuit design. As the circuit design's various states are entered and transition arcs are followed, the map in the coverage database 104 is updated to reflect that these states and/or transition arcs have been exercised. The coverage database 104 is coupled to the coverage analysis tool 110. The coverage analysis tool 110 is coupled to the simulated design 112 in the test bench 108, and uses output data from simulated design 112 to determine which areas of the circuit design have been tested. The coverage analysis tool 110 then updates the coverage database 104 based upon this information. Coverage analysis tools are well known in the art.

The test generator 106 is coupled to receive data from the design database 102 and the coverage database 104, and in response generates a set of test vectors which are sent to the simulated design 112 in the test bench 108. The simulated design 112 is coupled to receive the test vectors from the test generator 106, and in response generates output data which is sent to both the coverage analysis tool 110 and the output log database 114. The simulated design 112 includes software (such as Verilog or VHDL) which is executed within a computer (not shown) to model the operational characteristics of the circuit design. The output log database 114 stores the output data from the simulated design 112 for later analysis by other EDA tools (not shown). The test bench 108 which executes the simulated design 112 is well known in the art.

Before the test generator 106 generates the test vectors, the test generator 106 performs a complete syntax and synthesizability check on a circuit design within the design database 102 that is to be tested. The test generator 106 indicates whether there are any syntax errors in the circuit design, and whether all parts of the design are synthesizable. The test generator 106 then expands any macros and data structures within the design description. Next, the test generator 106 analyzes the design description and identifies all inputs and outputs. The test generator 106 interprets the design description as a series of basic-blocks that are connected by a series of transition arcs, forming a state diagram. This state diagram is also known as a decision tree or a design flow graph. The test generator 106 verifies the stability of each basic block within the state diagram independent of all other basic blocks.

A basic block is the smallest building block in a design description. Basic blocks are defined at each point in the state diagram where either a condition is met or a calculation occurs. A set of basic blocks visited by consecutive transition arcs in the state diagram define a path. In a typical design description there are a very large number of paths. However, only a limited number of paths may be of interest to users. These are labeled 'paths-of-interest.'

For example, the following design description contains four basic blocks:

| If (a < b) then | $1^{st}$ basic block |
|---|---|
| c = a − b | $2^{nd}$ basic block |
| else c = b − a endif | $3^{rd}$ basic block |
| result = c * 3 | $4^{th}$ basic block |

In the above example, transition arcs are defined between the $1^{st}$ basic block and the $2^{nd}$ basic block, the $1^{st}$ basic block and the $3^{rd}$ basic block, the $2^{nd}$ basic block and the $4^{th}$ basic block, and the $3^{rd}$ basic block and the $4^{th}$ basic block. Paths are defined from the $1^{st}$ basic block through the $2^{nd}$ basic block to the $4^{th}$ basic block, and from the $1^{st}$ basic block through the $3^{rd}$ basic block to the $4^{th}$ basic block.

The test generator 106 automatically constructs a first set of test vectors for causing each state of the state machine to be visited and each transition arc to be taken. This first set of test vectors proves whether each of the basic blocks that make up the design description are correct. The test generator 106 then produces a second set of test Vectors for proving that user-selected subsets of the basic blocks work together correctly. These subsets of the basic blocks, when linked together, are equivalent to the paths of interest discussed above.

All test vectors are generated with the test generator 106 by first identifying any untested design description elements, such as basic blocks, transition arcs, or paths of interest, from the coverage database 104, and then automatically generating a set of test vectors to exercise those elements. This testing may take place at any level of granularity, ranging from the design description's top-level inputs and outputs, to the individual logic elements.

The test generator 106 creates a test vector by first determining which basic block, transition arc, or path is to be tested next. The test generator 106 then determines what variables need to be set or what conditions need to occur so that the simulated design 112 transitions to an untested element from a currently active basic block. This is called "back-solving." The test generator may also use a "forward solving" approach to decide what sequence of actions to take in order to activate targeted arcs, blocks, or paths from the given state of the design. In general, the test generator 106 chooses test vectors that exercise a greatest number of untested elements.

Active basic blocks are defined as those that are waiting for some variable to be set or condition to occur before passing control to another basic block. Conditions that need to occur are typically defined in terms of some timing constraint. For example, a variable may need to be set to a certain state ten clock pulses after another variable transitions to a different state in order for control to be passed from a currently active basic block to another basic block.

A complete set of test vectors is called a test frame. The test frame is submitted to the test bench 108 where the simulated design 112 simulated by the test vectors. In response, the simulated design 112 generates and sends a set of output data to the output log database 114 and the coverage analysis tool 110, as discussed above.

Based on the feedback provided by the coverage analysis tool 110, the test generator 106 again checks whether all of the basic blocks, transition arcs, and paths of interest have been tested. If any remain untested, the test generator 106 repeats the back-solving process.

During the course of this iterative testing, the test generator 106 uses the data in the coverage database 104 to explore whether the simulated design 112 is stable for all given inputs, and whether the simulated design 112 contains any unreachable states or un-exercisable transition arcs.

Figure 2:
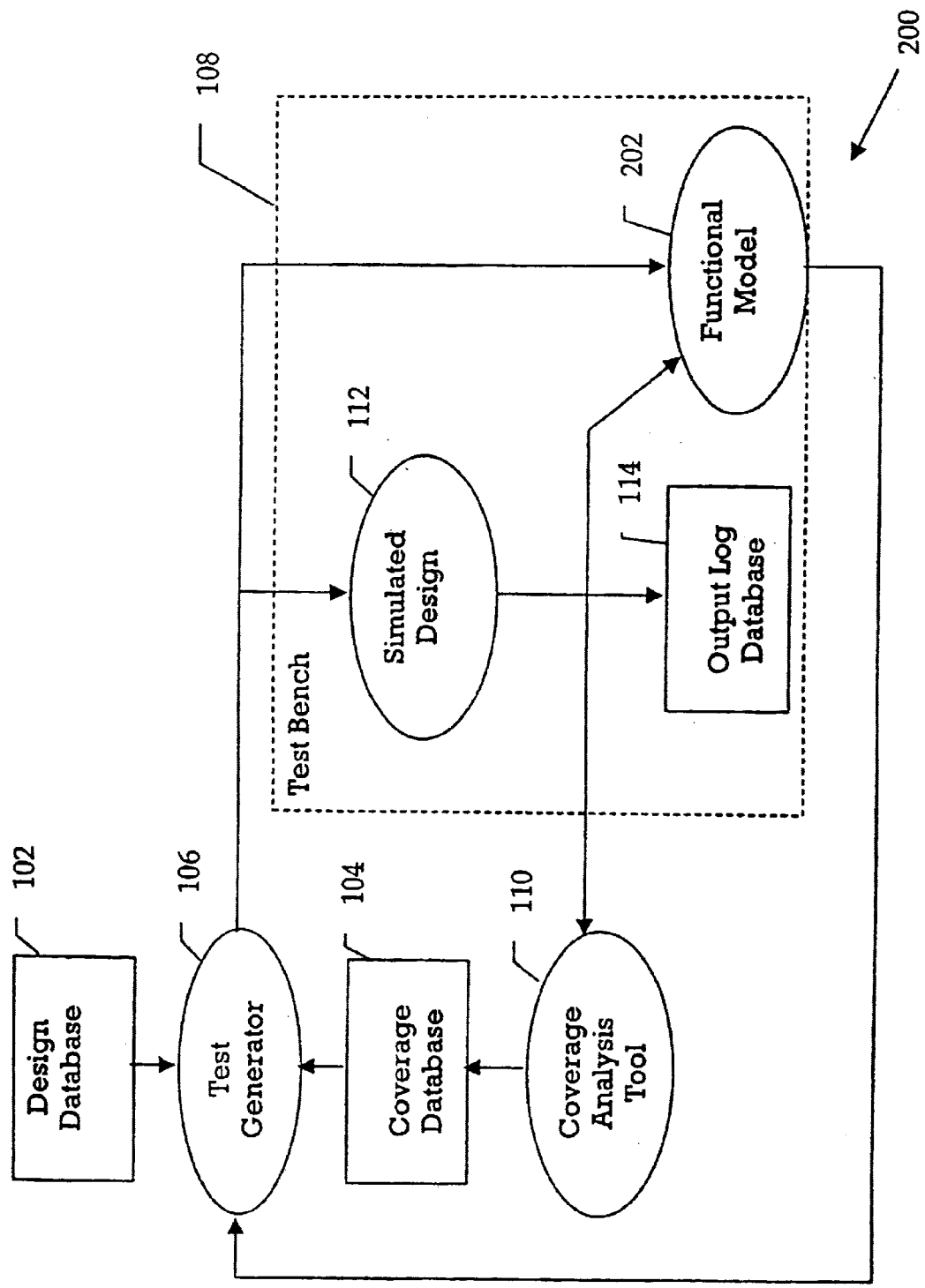
FIG. 2 is a data-flow diagram of a second exemplary system for automated design verification according to the present invention.

FIG. 2 is a data-flow diagram of a second exemplary system 200 for automated design verification according to the present invention. In addition to the elements introduced in FIG. 1, the second system 200 includes a functional model 202. This model 202 is coupled to receive test vectors from the test generator 106, output data from the simulated design 112, and verify the output data's accuracy. The functional model 202 compares the output data from the simulated design 112 with a set of expected values generated by the functional model 202. These expected values are intended to reflect how the design description should operate in response to the test vectors generated by the test generator 106. The functional model 202 labels the output data from the simulated design 112 as either correct or incorrect. The functional model 202 also flags indeterminate conditions, such as when the simulated design 112 does not generate any output data in response to a test vector.

The functional model 202 is a non-cycle-accurate model of the simulated design 112. A non-cycle-accurate model is one that does not attempt to mimic the simulated design 112 during each cycle of the simulation. The functional model 202 can generate a set of expected values in one of several ways. For instance, the functional model 202 can be implemented as a database lookup table or as an algorithm. For example, while the simulated design may be comprised of a set of commands for defining a series of AND and OR gates interconnected with latches and registers, which together implement a multiplication function, the functional model 202 could simply perform a logical multiplication with a program written with an off-the-shelf C or C++ programming language.

The test generator 106 is coupled to receive the results generated by the functional model 202, thus creating a second feedback loop in the system 200. The test generator 106 correlates the test vectors sent to the simulated design 112 with the results from the functional model 202 to localize and identify which of the basic blocks, transition arcs, and/or paths within the simulated design 112 operate incorrectly or indeterminately. The test generator 106 can then be programmed to automatically generate a more detailed series of tests focused on the incorrect or indeterminate design elements. Alternatively, the test generator 106 only prints out the set of test results which a designer then uses to manually generate a more detailed series of tests.

Figure 3:
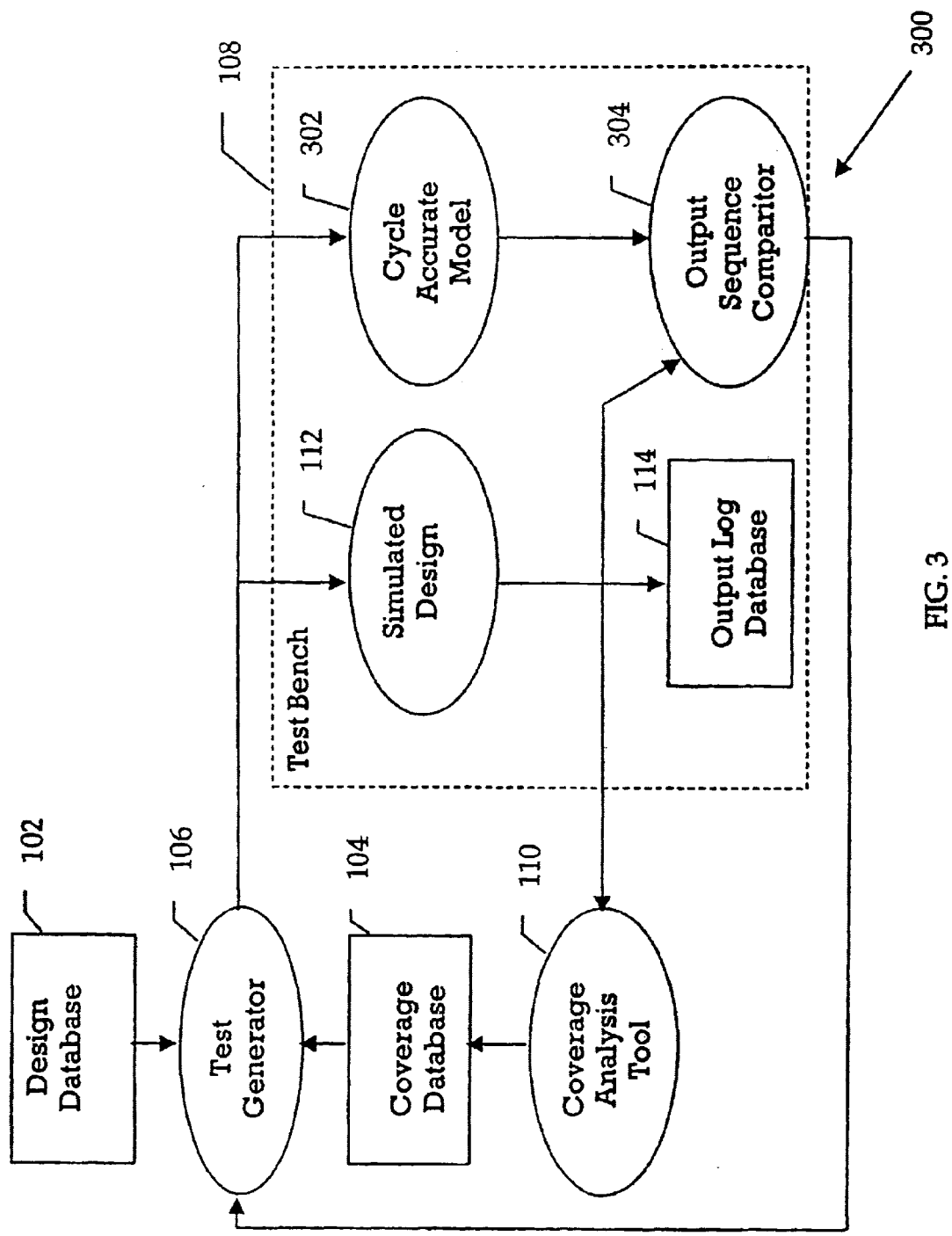
FIG. 3 is a data-flow diagram of a third exemplary system for automated design verification according to the present invention.

FIG. 3 is a data-flow diagram of a third exemplary system 300 for automated design verification according to the present invention. In addition to the elements introduced in FIG. 1, the third system 300 includes a cycle accurate model 302 and an output sequence comparator 304. The cycle accurate model 302 is coupled to receive the test vectors from the test generator 106 and is designed to match cycle-for-cycle the output data from the simulated design 112. The output sequence comparator 304 is coupled to receive output data from both the simulated design 112 and the cycle accurate model 302. The output sequence comparator 304 compares every cycle of the output data and generates a set of results which labels the output data from the simulated design 112 as either correct, incorrect, or indeterminate.

The test generator 106 is coupled to receive the results generated by the output sequence comparator 304, thus creating a second feedback loop in the system 300. The test generator 106 then correlates the test vectors sent to the simulated design 112 with the results from the output sequence comparator 304 to localize and identify whether the basic blocks, transition arcs, and/or paths within the simulated design 112 are operating incorrectly or indeterminately. The test generator 106 is then programmed to either automatically generate a more detailed series of tests which center about any incorrect or indeterminate design elements, or to print out the results for a designer to review.

The test generator 106, the coverage analysis tool 110, the simulated design 112, the functional model 202, the cycle accurate model 302, and the output sequence comparator 304 are software modules comprised of computer program instructions that run on a computer (not shown). The computer includes a processing unit and a memory. The memory stores computer program instructions for controlling how the processing unit accesses, transforms and outputs data. Those skilled in the art will recognize that the internal memory can be supplemented with other computer useable storage media, including a compact disk, a magnetic drive or a dynamic random access memory.

Figure 4:
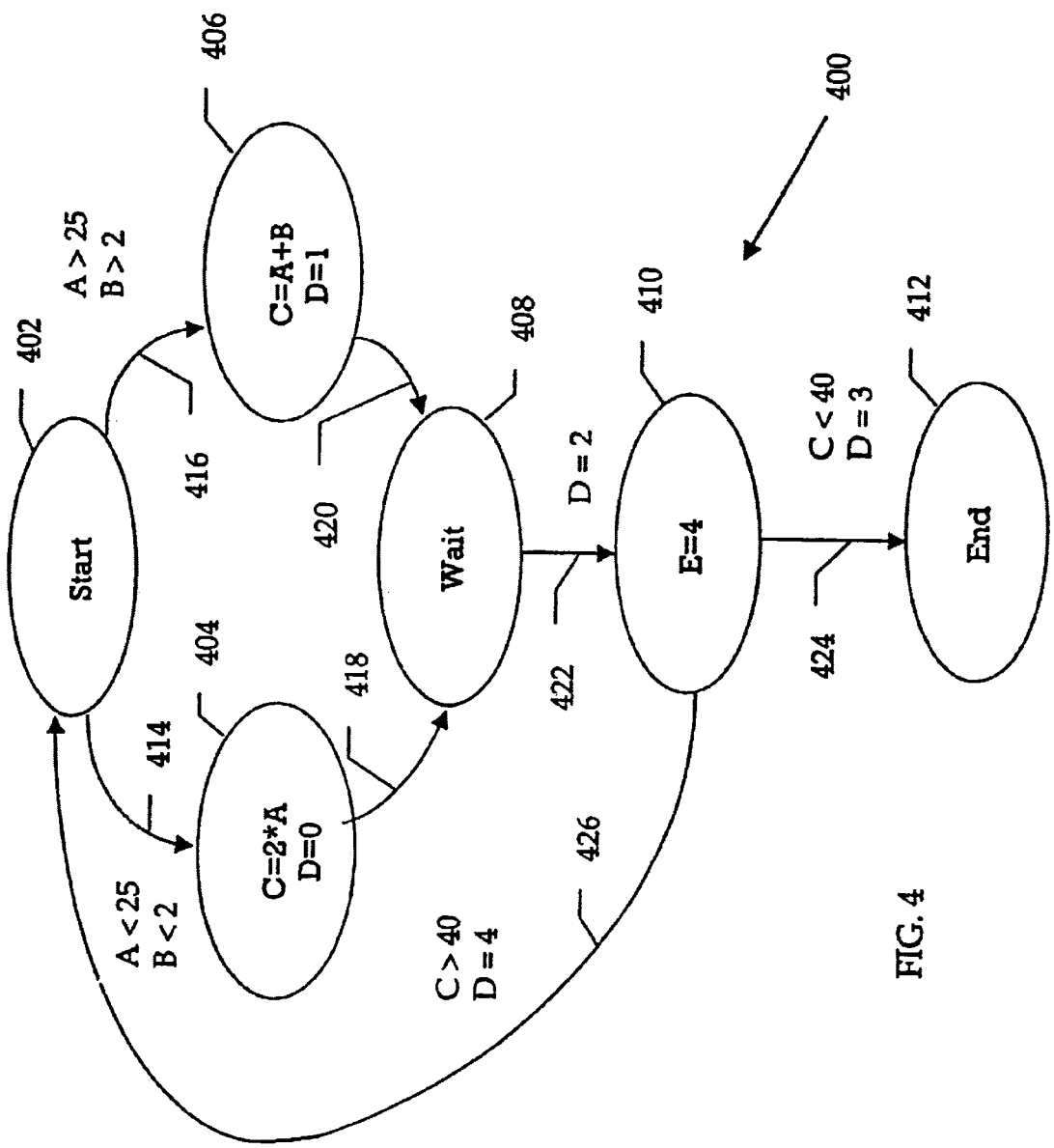
FIG. 4 is a state diagram of an exemplary circuit design that is to be tested with the present invention.

FIG. 4 is a state diagram 400 of an exemplary circuit design tested using the present invention. The following discussion illustrates how the test generator 106 produces a set of test vectors to test the state diagram 400 and how the test generator 106 responds to the test results.

To begin, the test generator 106 has identified six basic blocks 402 through 412 and seven transition arcs 414 through 426. At least four paths exist, however, recursive arc 426 theoretically permits an infinite number of paths to be defined. The test generator 106 proceeds to generate test vectors which set variables A and B so that each basic block, transition arc, and path of interest is tested. Predetermined paths of interest are loaded into the test generator 106 by a user. The test generator 106 can also be pre-programmed with assertions, which will generate an alert upon the occurrence of certain conditions. (for example, if C ever equals D).

During testing of basic block 410 in the state diagram 400, for example, the test generator 106 exercises transition arc 424, where C<40, and transition arc 426, where C>40. However, the test generator 106 also attempts to test the case where C=40. Since a next state has not been defined in the state diagram 400 for the case where C=40, the test generator alerts a user to this indeterminate case. It is through this automatic testing process that the circuit design is fully tested and any errors in the design are brought to a user's attention.

Figure 5A:
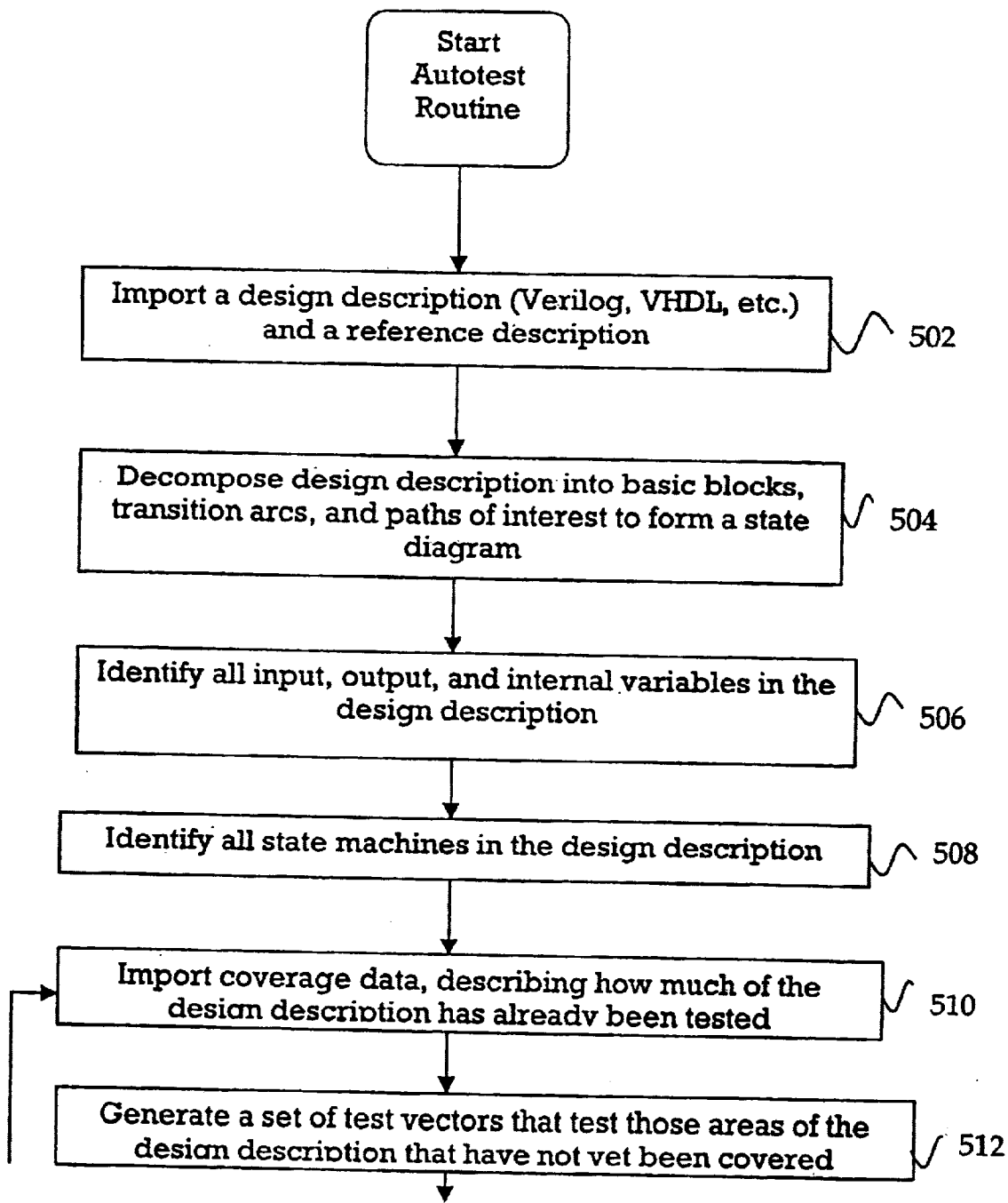
FIGS. 5A and 5B are a flowchart of a method for automated design verification.
Figure 5B:
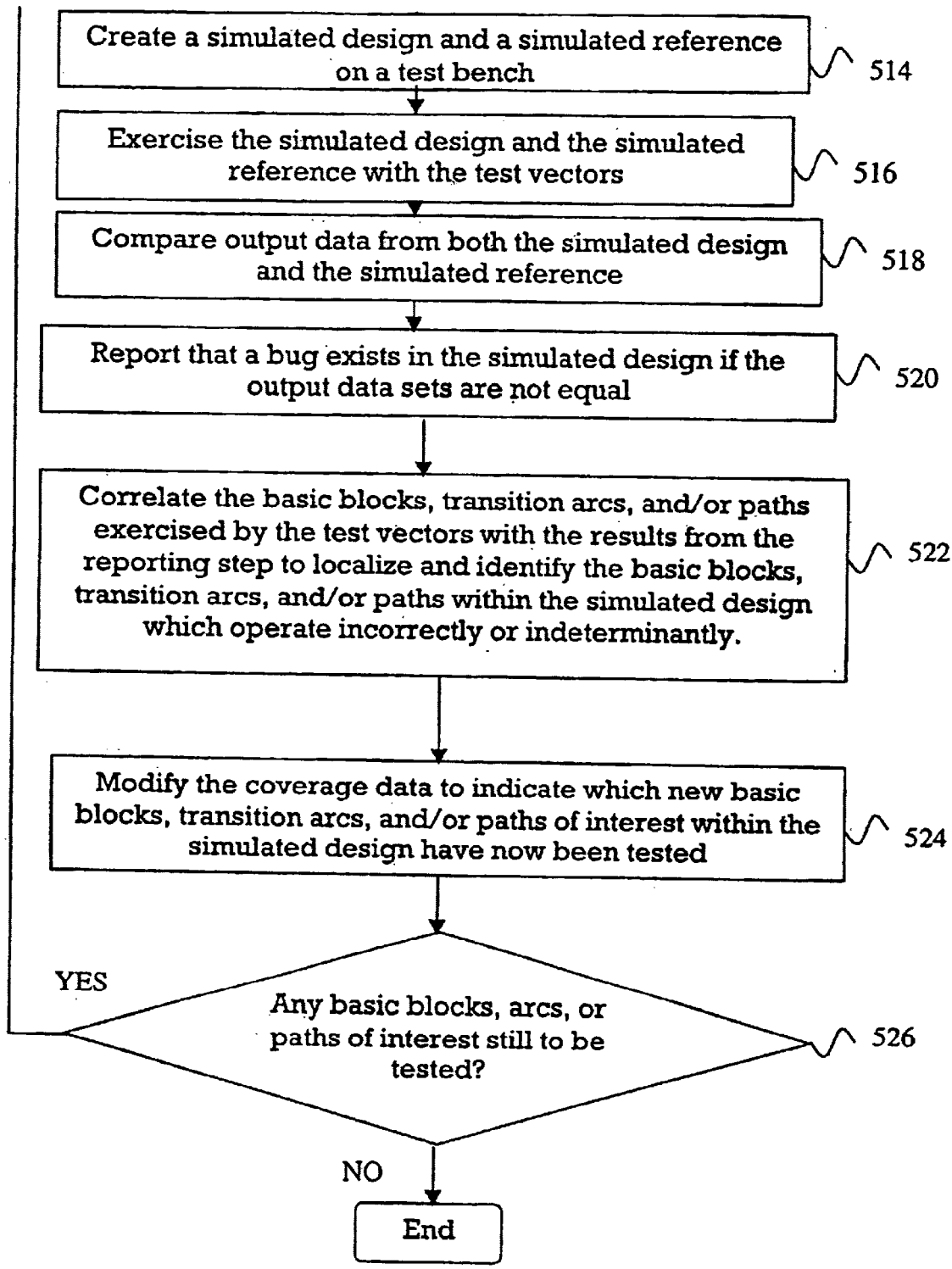

FIG. 5 is a flowchart of a method for automated design verification. The method begins in step 502 where the test generator 106 imports a design description (typically defined in terms of a hardware description language such as Verilog or VHDL) from the design database 102, and the test bench 108 imports a reference description from another database (not shown). The reference description optionally forms the basis of either the functional model 202 or the cycle accurate model 302. Next, in step 504, the test generator 106 decomposes the design description into basic blocks, transition arcs, and paths of interest to form a state diagram. In step 506, the test generator 106 identifies all input, output, and internal variables in the design description. In step 508, the test generator 106 identifies all state machines in the design description. Then, in step 510, the test generator 106 imports coverage data, describing how much of the design description has already been tested, from the coverage database 104. In step 512, the test generator 106 generates a set of test vectors that test those areas of the design description that have not yet been covered. (Step 512 is further described in FIG. 6.) In step 514, the test generator 106 creates the simulated design 112 and a simulated reference on the test bench 108. The simulated reference is equivalent to a first portion of the functional model 202, or alternatively to the cycle accurate model 302. Now, in step 516, the test generator 106 transmits the test vectors to the test bench 108 for exercising the simulated design 112 and the simulated reference. In step 518, a second portion of the functional model 202, or alternatively the output sequence comparator 304, compares output data from both the simulated design 112 and the simulated reference. In step 520, the second portion of the functional model 202, or alternatively the output sequence comparator 304, reports that a bug exists in the simulated design 112 if the output data sets are not equivalent. Next, in step 522, the test generator 106 correlates the basic blocks, transition arcs, and/or paths exercised by the test vectors with the results from the reporting step (step 520) to localize and identify the basic blocks, transition arcs, and/or paths within the simulated design which operate incorrectly or indeterminately. In step 524, the coverage analysis tool 110 modifies the coverage data to indicate which new basic blocks, transition arcs, and/or paths of interest within the simulated design 112 have now been tested. In step 526, if any basic blocks, arcs, or paths of interest are still to be tested the method returns to step 510, otherwise the process ends.

Figure 6:
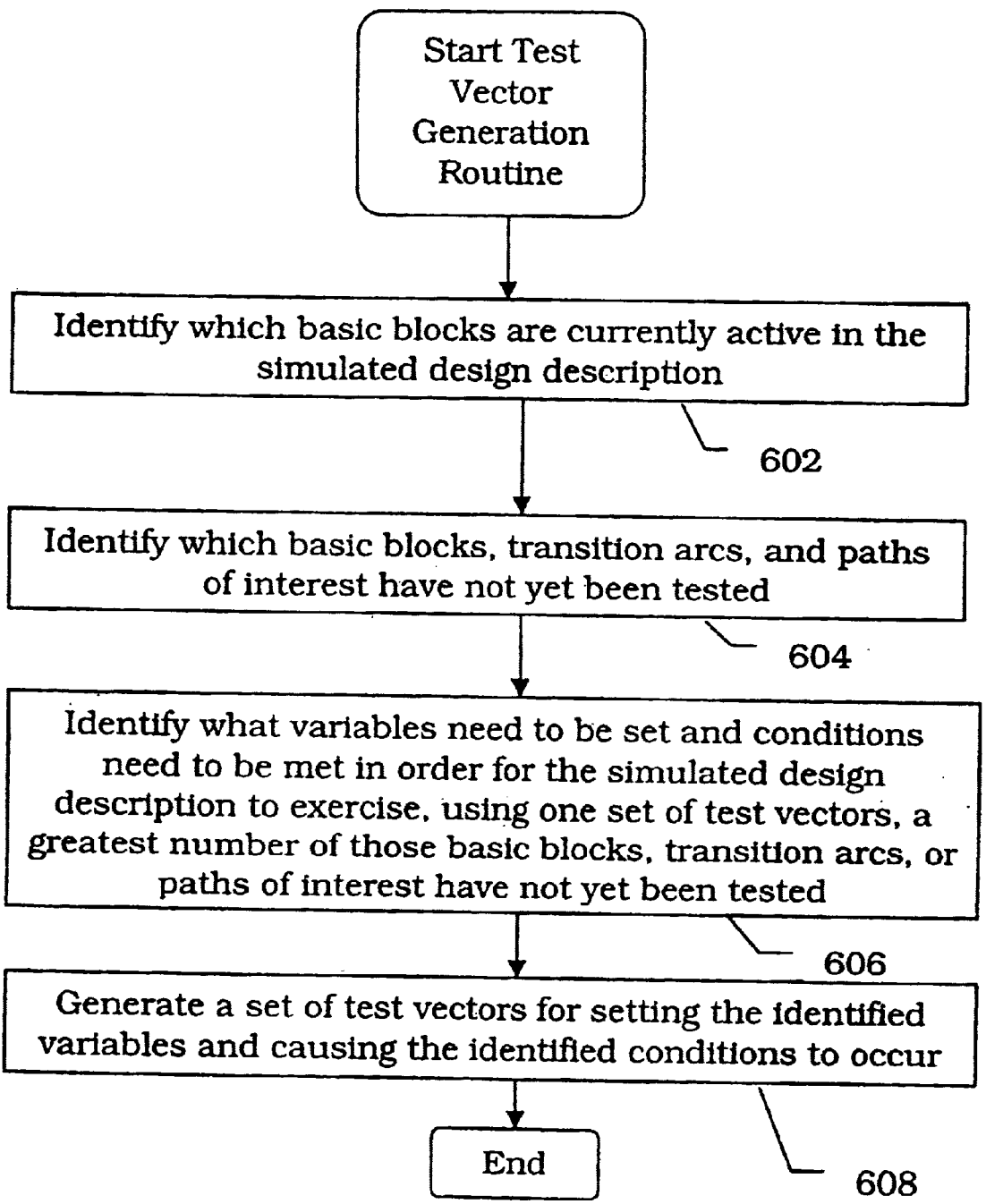
FIG. 6 is a flowchart of a method for generating a set of test vectors within the method for automated design verification.

FIG. 6 is a flowchart of a method for generating a set of test vectors for step 512 of the method of FIG. 5. The method begins in step 602 where the test generator 106 identifies which basic blocks are currently active in the simulated design description. A data base of active basic blocks is maintained by the system by continuously tracking the flow of control and data throughout the simulated system. Then, in step 604, the test generator 106 accesses the coverage database 104 to identify which basic blocks, transition arcs, and paths of interest have not yet been tested. In step 606, the test generator 106 identifies what variables need to be set and what conditions need to occur for the simulated design 112 to exercise, using one set of test vectors, a greatest number of those basic blocks, transition arcs, or paths of interest have not yet been tested. In step 608, the test generator 106 generates a set of test vectors for setting the identified variables and for causing the identified conditions to occur. After step 608, the method for generating a set of test vectors ends.

While the present invention has been described with reference to a preferred embodiment, those skilled in the art will recognize that various modifications may be made. Variations upon and modifications to the preferred embodiment are provided by the present invention, which is limited only by the following claims.

What is claimed is:

1. An automated simulated electronics design verification system for electronic design automation, comprising:

a coverage database containing a map of a plurality of states and a plurality of transition arcs;

a test bench including a simulated electronics design and providing for simulation of said simulated electronics design with a test frame of a plurality of test vectors;

a coverage analysis tool monitoring said simulated electronics design, and identifying to said test bench at least one portion of said simulated electronics design that remains to be tested; and a test generator receives said coverage database information for creating said test frame of said test vectors and sending said test frame to said test bench;

wherein said test bench exercises said portions of said simulated electronics design identified by said coverage analysis tool with said test vectors of said test frame.

2. The system of claim 1, wherein said coverage database further contains said states represented within said simulated electronics design.

3. The system of claim 1, wherein said coverage database further contains said transition arcs represented within said simulated electronics design.

4. The system of claim 1, wherein said coverage database further contains said states represented within said test bench exercising said simulated electronics design.

5. The system of claim 1, wherein said coverage database contains said transition arcs represented within said test bench exercising said simulated electronics design.

6. The system of claim 1, wherein said coverage database contains at least one member of the collection comprising said states represented within said simulated electronics design and said transition arcs represented within said simulated electronics design.

7. The system of claim 6, wherein said coverage database contains at least one member of the collection comprising said states represented within said test bench exercising said simulated electronics design and said transition arcs represented within said test bench exercising said simulated electronics design.

8. The system of claim 6, further comprising:

a comparator for comparing output data from said simulation of said simulated electronics design with at least one member of the collection comprising a reference data and a constraint data computed by said test bench; and an output log database containing at least one member of the collection containing at least one output data result and at least one anomaly report;

wherein said output data from said simulation of said simulated electronics design is compared by said comparator, reporting to said output log at least one member of the collection comprising said output data results and said anomaly reports.

9. The system of claim 1, further comprising:

a comparator for comparing at least one output data from simulation of said simulated electronics design with at least one member of the collection comprising a reference data and a constraint data computed by said test bench.

10. The system of claim 9, further comprising:

an output log database containing at least one member of the collection comprising at least output data result and at least one anomaly report.

11. The system of claim 1, further comprising:

a design database for storing a hardware design coding language representation of a circuit design.

12. A method of automatic circuit design verification, comprising the steps of:

inputting a reference description from a database with a test bench wherein said reference description optionally provides a basis of a functional model;

identifying a plurality of states and a plurality of transition arcs in at least one member of the collection comprising a design description and said reference description;

fetching coverage data that describes how much of said design description has already been tested from a coverage database;

generating with said test generator a set of at least one test vector to test at least one portion of said simulated electronics design that has not yet been covered;

transmitting with said test generator said set of said test vectors to said test bench to exercise said simulated electronics design;

modifying with a coverage analysis tool said coverage database to indicate which of said states and of said transition arcs have been tested; and repeating the generation step if any portion of the simulated electronics design remains untested.

13. The method of claim 12, further comprising the steps of:

extracting at least one initial coverage goal from said plurality of said states and said plurality of said transition arcs identified in at least one member of the collection comprising said design description and said reference description.

14. The method of claim 13, further comprising the steps of:

transmitting said set of said test vectors to said test bench to exercise said reference model;

comparing the output of said simulated electronics design for said set of said test vectors with the output of said reference model for said set of said test vectors; and reporting any differences between the compared output data.

15. The method of claim 14, wherein said reference model includes a reference functional model.

16. The method of claim 14, wherein said reference model includes a cycle accurate model.

* * * * *